United States Patent
Fujihara et al.

(10) Patent No.: US 7,280,573 B2
(45) Date of Patent: Oct. 9, 2007

(54) SEMICONDUCTOR LASER UNIT AND OPTICAL PICKUP DEVICE

(75) Inventors: Kiyoshi Fujihara, Shiga (JP); Masaya Tateyanagi, Shiga (JP); Shigeki Okamoto, Kyoto (JP)

(73) Assignee: Matsushita Electirc Industrial Co., Ltd., Osaka (JP)

( * ) Notice: Subject to any disclaimer, the term of this patent is extended or adjusted under 35 U.S.C. 154(b) by 0 days.

(21) Appl. No.: 11/480,478

(22) Filed: Jul. 5, 2006

(65) Prior Publication Data

US 2007/0008862 A1   Jan. 11, 2007

(30) Foreign Application Priority Data

Jul. 5, 2005   (JP) .............................. 2005-196226

(51) Int. Cl.
*H01S 3/04* (2006.01)
(52) U.S. Cl. ................. 372/36; 372/43.01; 372/50.21; 257/672; 257/730
(58) Field of Classification Search ............ 372/50.21, 372/50.1, 43.01, 36, 34; 257/672, 730, 731; 369/121, 122
See application file for complete search history.

(56) References Cited

U.S. PATENT DOCUMENTS 5,748,658 A * 5/1998 Nakanishi et al. ....... 372/43.01
2002/0060971 A1 * 5/2002 Mori et al. ............. 369/112.04
2004/0180470 A1 * 9/2004 Romano et al. ........... 438/106
2005/0094694 A1 * 5/2005 Fujihara et al. ............ 372/43
2005/0152634 A1 * 7/2005 Okamoto et al. ........... 385/14
2005/0274882 A1 * 12/2005 Minamio et al. .......... 250/239

FOREIGN PATENT DOCUMENTS

| JP | 08-227532 | 9/1996 |
|---|---|---|
| JP | 2001-111159 | 4/2001 |
| JP | 3412609 | 4/2001 |
| JP | 2002-198605 | 7/2002 |
| JP | 2003-067959 | 3/2003 |

\* cited by examiner

*Primary Examiner*—Minsun Oh Harvey
*Assistant Examiner*—Kinam Park
(74) *Attorney, Agent, or Firm*—McDermott Will & Emery LLP

(57) ABSTRACT

The semiconductor laser unit includes: a metal plate having a center portion wider than the remaining portions; a flexible substrate having a first opening; a substrate mounted on the center portion; a semiconductor laser placed on the substrate; a frame having a second opening and fixing the flexible substrate in the state of being bent along from the top surface to both side faces of the metal plate; and an optical element covering the second opening. The flexible substrate is fixed so that the first opening extends over the top surface and both side faces of the center portion.

7 Claims, 4 Drawing Sheets

SEMICONDUCTOR LASER UNIT AND OPTICAL PICKUP DEVICE

BACKGROUND OF THE INVENTION

1. Technical Field of the Invention

The present invention relates to a semiconductor laser unit, and more particularly, to a semiconductor laser unit constituting an optical pickup for writing/reading information into/from a recording medium such as an optical disk, in particular, including a digital versatile disk (DVD) and a compact disk (CD), for example, and an optical pickup device provided with such a semiconductor laser unit.

2. Prior Art

In recent years, as recording media for not only music information but also video information, CDs (CD-ROM, CD-R, CD-RW, etc.) and DVDs (DVD-ROM, DVD-RW, DVD-RAM, etc.) have rapidly widespread. At the same time, optical disk drives for writing information into such recording media and reading written information from such recording media have also rapidly widespread. Optical pickup devices, which serve as the key parts of such optical disk drives, have been strongly requested to attain higher power for supporting high-speed recording, enhance functions for supporting both CD and DVD standards and reduce the size with thinning of optical disk drives. Accordingly, semiconductor laser units used for such optical pickup devices are requested to improve the heat dissipation of packages for attaining higher power, support a larger number of pins for enhancing functions and provide a narrow package structure for reducing the size.

A semiconductor laser unit for a conventional optical pickup device will be described, taking as an example a semiconductor laser unit described in Japanese Patent Gazette No. 3412609, with reference to FIGS. 6A and 6B.

FIG. 6A is a top view of a conventional semiconductor laser unit, and FIG. 6B is a cross-sectional view of the conventional semiconductor laser unit taken along line VIb-VIb in FIG. 6A.

As shown in FIGS. 6A and 6B, the conventional semiconductor laser unit includes: a lead frame 1600; a silicon substrate 1630 mounted on the lead frame 1600; a semiconductor laser 1640 placed on the silicon substrate 1630 in the center of a package 1610 for outputting laser light upwardly; light-receiving elements 1620 as chips placed on the silicon substrate 1630; the package 1610 molded with a resin mold for sealing the lead frame 1600; a 45-degree reflector for reflecting the laser light toward the top of the package 1610; and a hologram element 1650 with a grating pattern 1650*b* formed on the bottom surface and a hologram pattern 1650*a* formed on the top surface. A circuit for processing reflected light from an optical disk received by the light-receiving elements 1620 is also formed on the silicon substrate 1630.

In the conventional semiconductor laser unit described above, as shown in FIG. 6B, output light 1660 from the semiconductor laser 1640 is reflected with the reflector toward the top of the package 1610, is diffracted with the grating pattern 1650*b* and then passes through the hologram element 1650. The output light 1660 then travels through optical components (not shown) such as a collimating lens and an objective lens to reach an optical disk (not shown). Reflected light 1670 from the optical disk travels in reverse the same route as the output light 1660, is diffracted with the hologram pattern 1650*a* and is then incident on the signal processing circuit and the light-receiving elements 1620.

When it is attempted to achieve higher power, function enhancement and size reduction for an optical pickup device with the semiconductor laser unit having the construction described above, two major problems arise: one is improvement in heat dissipation associated with achievement of higher power, and the other is narrowing of the pin pitch associated with achievement of function enhancement and size reduction.

In general, in an optical disk drive adapted to high-speed recording, it is required to output high-power light of 200 mW or more from the semiconductor laser unit. To accomplish this, the temperature of the semiconductor laser 1640 will rise due to increase of the drive current of the semiconductor laser 1640, and this will degrade the reliability of the semiconductor laser 1640. To ensure stable driving of the semiconductor laser 1640, heat generated during driving must be dissipated efficiently. However, in the conventional semiconductor laser unit described above, the package 1610, which is formed of a resin having low heat conductivity (about 0.5 W/m/deg), is highly heat resistive in structure and thus fails to dissipate heat efficiently.

Also, when it is attempted to reduce the size of the package 1610 in the conventional semiconductor laser unit having the construction described above, the width of the package 1610 will be narrowed, and this will result in imposing a limitation on increase of the number of pins that may become necessary with function enhancement. The reason is that while the pin pitch must be narrowed to increase the number of pins with the narrowed width of the package 1610, a pitch of about 0.4 mm is the minimum possible pitch, and no pitch narrower than about 0.4 mm is available, in the current processing technology for the lead frame 1600.

A semiconductor laser unit with improved heat dissipation is described in Japanese Laid-Open Patent Publication No. 2003-67959. In this semiconductor laser unit, a metal substrate is attached to the bottom of a laser unit portion on which a semiconductor laser is mounted, to enable efficient dissipation of heat generated in the semiconductor laser.

In an optical head device described in Japanese Laid-Open Patent Publication No. 8-227532, an optical element structure is attached to a plate made of metal, to improve the heat dissipation efficiency.

A semiconductor laser unit described in Japanese Laid-Open Patent Publication No. 2002-198605 uses a bent flexible substrate as a wiring substrate, and this can reduce the wiring width. Moreover, this conventional semiconductor laser unit can dissipate heat generated in a semiconductor laser efficiently via the backside of a metal island.

However, the conventional devices described above have the respective problems as follows. The semiconductor laser unit described in Japanese Laid-Open Patent Publication No. 2003-67959 finds difficulty in achieving both size reduction and function enhancement.

The optical head device described in Japanese Laid-Open Patent Publication No. 8-227532 finds difficulty in thinning the device because a flexible substrate protrudes from the plate. Moreover, the optical head device may possibly be contaminated with dust generated during bonding of a case.

The fabrication process for the semiconductor laser unit described in Japanese Laid-Open Patent Publication No. 2002-198605 is complicated and finds difficulty in shortening the work time, and this makes it difficult to secure the placement accuracy of each component sufficiently. Moreover, in this conventional semiconductor laser unit, the flexible substrate is bonded to the metal island with terminal portions of the flexible substrate being bent. This complicates the work during fabrication, and thus may possibly fail to obtain sufficient bonding strength at connection portions.

SUMMARY OF THE INVENTION

In view of the above problems, an object of the present invention is providing a semiconductor laser unit that is good in heat dissipation efficiency, small in size, prevented from occurrence of disconnection and easy in assembling.

The semiconductor laser unit of the present invention includes: a metal plate having a first portion and a second portion wider than the first portion; a flexible substrate having a first opening and a wiring pattern, part of the flexible substrate being bonded to the top surface of the first portion; a semiconductor substrate mounted on the top surface of a portion of the metal plate located inside the first opening as viewed from the top, the semiconductor substrate having a light-receiving element; a light-emitting element placed on the semiconductor substrate; and a frame having a second opening at a position overlapping the light-emitting element as viewed from the top and covering the first portion, the second portion and the semiconductor substrate, the frame fixing the flexible substrate in the state of being bent along from the top surface to both side faces of the first portion.

With the construction described above, in which the second portion of the metal plate is widened, the flexible substrate is prevented from having a physical load from the frame and the side faces of the metal plate. Therefore, the wiring pattern on the flexible substrate is less likely to cause poor connection such as disconnection. The second portion may be a center portion on which the semiconductor substrate is mounted, or may be a portion other than the center portion.

Since the metal plate is placed under the semiconductor substrate having the light-receiving and light-emitting elements, the light dissipation efficiency improves. Therefore, the semiconductor laser unit of the present invention can be used even under a higher-temperature environment than in the conventional cases.

The semiconductor laser unit of the present invention uses the flexible substrate having a wiring pattern. Therefore, the wiring pitches in the inner portions facing the semiconductor substrate and the outer portions for connection with external equipment can be significantly reduced compared with the conventional semiconductor laser units using no flexible substrate. This makes it possible to reduce the area of the semiconductor laser unit even if the number of terminals increases as the functions of the laser unit are further enhanced.

The semiconductor laser unit of the present invention may have a transparent optical element attached to the frame, to thereby prevent the semiconductor laser and the light-receiving element from contamination with dust and the like. Assembly of the semiconductor laser unit of the present invention is comparatively easy. Also, a diffraction pattern can be formed on the optical element. Therefore, the number of components necessary for the resultant optical disk drive can be reduced.

Using the semiconductor laser unit of the present invention, it is possible to fabricate a high-performance, small-size and highly reliable optical pickup device.

In the semiconductor laser unit of the present invention, the light-receiving/emitting portions as the heat-producing sources are placed on the top surface of the metal plate. Therefore, the present invention has the effect of implementing a semiconductor laser unit that allows efficient heat dissipation. Using such a semiconductor laser unit, an optical disk drive usable under a higher-temperature environment than in the conventional cases can be implemented.

In the semiconductor laser unit of the present invention, the flexible substrate is bent along the top surface and both side faces of the metal plate, not protruding in the direction of the thickness of the optical pickup device. Therefore, a thin optical pickup device can be implemented.

In the semiconductor laser unit of the present invention, the width of the portion of the metal plate coming into contact with the frame is made larger than the width of the portion of the metal plate on which the flexible substrate is bent by the amount equal to or larger than the thickness of the flexible substrate. Therefore, the flexible substrate is prevented from having a strong physical load from the side faces of the metal plate and the frame. This prevents occurrence of disconnection in the flexible substrate.

The frame covers the light receiving/emitting portions. Therefore, the light receiving/emitting portions can be protected against intrusion of dust and the like thereinto during installation of the semiconductor laser unit into the optical pickup device. This makes it possible to implement an optical pickup device having stable properties.

With use of the flexible substrate permitting fine-pitch wiring, the semiconductor laser unit of the present invention can support a larger number of pins for enhancing functions while reducing the area. This makes it possible to implement a thin and multifunctional optical disk drive.

In the semiconductor laser unit of the present invention, in the case of providing an optical element for diffracting output light from the light-emitting element and incident light onto the light-receiving element, it is unnecessary to place any diffraction grating or hologram element externally. Thus, the number of components required for the optical disk drive, as well as the fabrication cost thereof, can be reduced.

DESCRIPTION OF THE PREFERRED EMBODIMENTS

Embodiment 1

A semiconductor laser unit of Embodiment 1 according to the present invention will be described with reference to FIGS. 1A to 1C and FIGS. 2A and 2B.

Figure 1A:
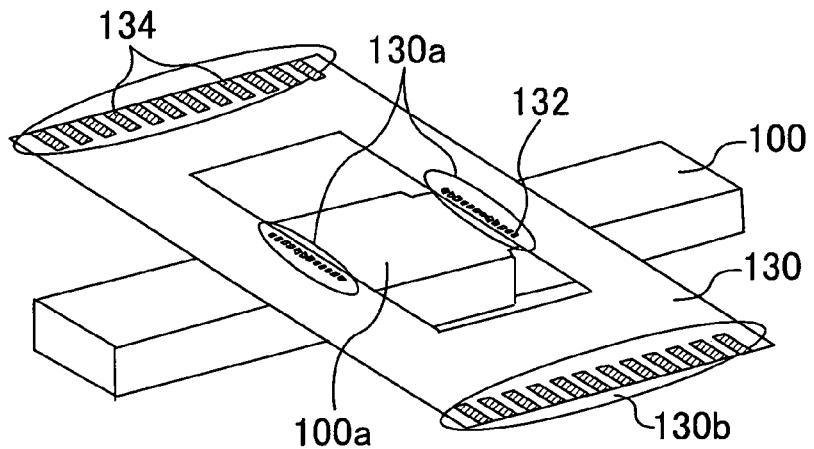
FIGS. 1A to 1C are perspective views illustrating a fabrication method for a semiconductor laser unit of Embodiment 1 according to the present invention.
Figure 1B:
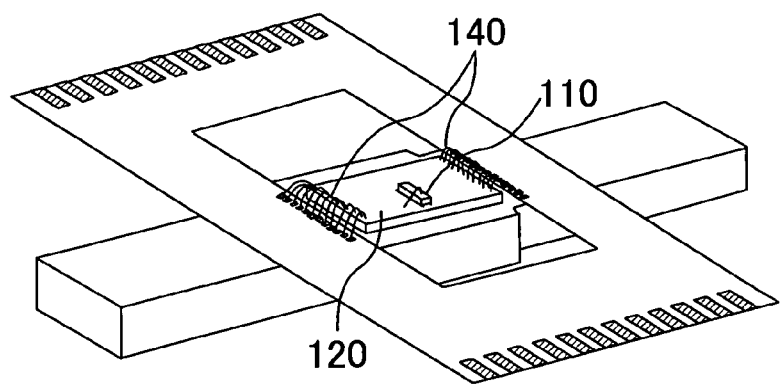
Figure 1C:
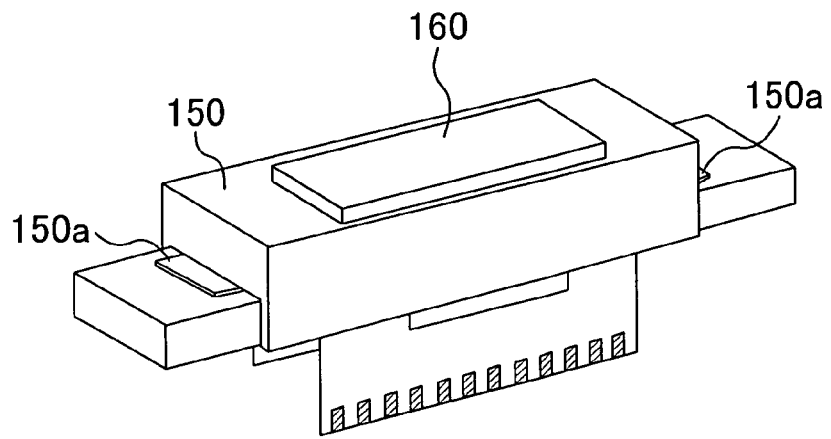
Figure 2A:
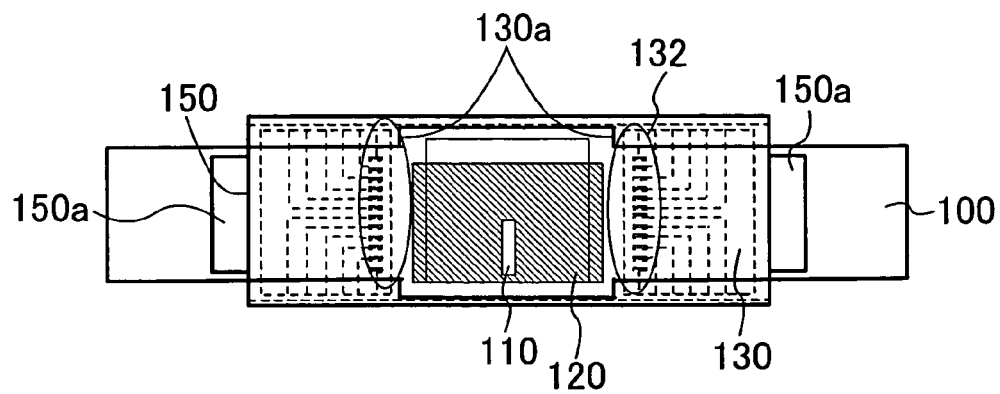
FIGS. 2A and 2B are a top view and a side view, respectively, of the semiconductor laser unit of Embodiment 1.
Figure 2B:
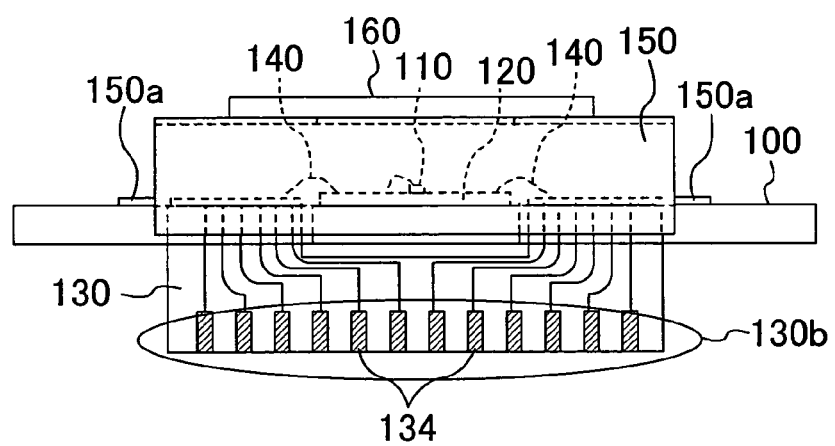

FIGS. 1A to 1C are perspective views illustrating a fabrication method for the semiconductor laser unit of this embodiment. FIGS. 2A and 2B are a top view and a side view, respectively, of the semiconductor laser unit of this embodiment.

The semiconductor laser unit of this embodiment has a simple structure easy in assembling, provides easy heat dissipation, and achieves function enhancement and size reduction.

The semiconductor laser unit of this embodiment is assembled in the following manner.

First, as shown in FIG. 1A, a metal plate 100 made of copper and the like and a flexible substrate 130 having an opening in the center are prepared. The metal plate 100 has a center portion 100a located in the center in the length direction that is wider (larger in the width direction) than the remaining portions as viewed from the top. The flexible substrate 130, which is rectangular in outside shape, for example, has terminals 132 formed on the top surfaces of edge portions (inner portions 130a) along the longer sides of the opening and pads 134 formed on the top surfaces of end portions (outer portions 130b) along the shorter sides of the flexible substrate 130.

The back surface (surface having no terminals 132 or pads 134 formed thereon) of the flexible substrate 130 is then bonded to the top surface of the metal plate 100, so that the wider center portion 100a of the metal plate 100 fit in the opening of the flexible substrate 130. Note that in the metal plate 100, the difference in width between the center portion 100a and the portions to which the flexible substrate 130 is bonded for each side should be equal to or more than the thickness of the flexible substrate 130. The thickness of the flexible substrate is about 0.1 mm, for example.

Subsequently, as shown in FIG. 1B, a silicon substrate 120 on which a semiconductor laser (light-emitting element) 110 is mounted is fixedly bonded to the center portion 100a of the metal plate 100. The terminals 132 on the inner portions 130a of the flexible substrate 130 are then connected to terminals provided on the silicon substrate 120 with wires 140.

Thereafter, as shown in FIG. 1C, a metal frame 150 is slid down from above to fit over the metal plate 100, and then, the metal frame 150 is fixed by making a flange portion 150a of the metal frame 150 to adhere to or welding to the metal plate 100. Whereby, the portions of the flexible substrate 130 protruding from the metal plate 100 on both sides as viewed from the top are bent down to flank the metal plate 100 with the frame 150. In other words, the flexible substrate 130 is bent in an inverted U shape with the pads 134 facing externally. Note that the width of the opening (length of the longer side of the opening in the example of FIGS. 1A to 1C) of the flexible substrate 130 should be greater than the sum of the width of the center portion 100a and the thicknesses of both side faces of the metal plate 100. This ensures that the flexible substrate 130 be bent down without being caught on the center portion 100a of the metal plate 100 when the frame 150 is slid down. Moreover, since the difference in width between the center portion 100a and the other portions of the metal plate 100 for each side is made greater than the thickness of the flexible substrate 130, the flexible substrate 130 is free from being loaded even if the inner width of the frame 150 is narrow. Thus, a risk of occurrence of disconnection on the flexible substrate 130 is avoided.

The frame 150 has an opening at a position overlapping the center portion 100a of the metal plate 100 as viewed from the top. After the fitting of the frame 150, a glass plate-shaped optical element 160 having a plane size greater than the opening is fixedly bonded to the frame 150, to cover the opening of the frame 150 with the optical element 160.

Next, the construction of the semiconductor laser unit of this embodiment fabricated in the manner described above will be described with reference to FIGS. 2A and 2B, which also show the inside of the frame 150 for easiness of explanation.

As shown in FIGS. 2A and 2B, the semiconductor laser unit of this embodiment includes: the metal plate 100 having the center portion 100a (see FIG. 1A) located in the center in the length direction that is wider than the remaining portions thereof as viewed from the top; the silicon substrate 120 mounted on the center portion 100a with terminals formed on the top surface thereof; the semiconductor laser 110 placed on the silicon substrate 120; the flexible substrate 130 having an opening greater in plane size than the center portion 100a and bonded to the top surface of the metal plate 100; the frame 150 having an opening at a position overlapping the semiconductor laser 110 as viewed from the top and fixing the flexible substrate 130 in the state of being bent along from the top surface to both side faces of the metal plate 100 so that the opening of the flexible substrate 130 extends over the top surface and both side faces of the center portion 100a; and the transparent optical element 160 covering the opening of the frame 150.

The metal plate 100 is formed of metal such as nickel-plated copper. On the silicon substrate 120, a 45-degree micromirror is formed utilizing the silicon (111) plane. A light-receiving element as a light detection circuit, which includes a signal processing circuit is also formed on the silicon substrate 120.

On the flexible substrate 130, the pads 134 are placed on the outer portions 130b on the top surface thereof. The terminals 132 are formed on edge portions of the opening of the flexible substrate 130 at positions overlapping the metal plate 100 as viewed from the top, and interconnections are formed for connecting the terminals 132 with the pads 134. The terminals 132, the pads 134 and the interconnections are made of metal such as copper. A resin such as polyimide sandwiches the interconnections, to thereby constitute the flexible substrate 130. In the semiconductor laser unit of this embodiment, the wires 140 made of gold and the like are provided for electrically connecting the terminals 132 on the flexible substrate 130 with the terminals on the silicon substrate 120.

As shown in FIGS. 2A and 2B, in the flexible substrate 130, the terminals 132 placed on the inner portions 130a located above the metal plate 100 are lined with a spacing between terminals that is different from a spacing with which the pads 134 placed on the outer portions 130b located outside the metal plate 100 are lined. On the inner portions 130a, the terminals 132 each having an area of 0.1 mm×0.3 mm are formed along edges of the flexible substrate 130, while on the outer portions 130b, the pads 134 each having a width of 0.35 mm are lined at a pitch of 0.65 mm, for example, to avoid occurrence of problems such as a short circuit during installation into an optical disk drive.

In the semiconductor laser unit of this embodiment, the optical element 160 is made of a glass plate that allows passing of light outputted from the semiconductor laser 110 and light incident on the light-receiving element. The optical element 160 is fixed to the top surface of the frame 150 with an adhesive such as an UV-curing resin to cover the opening of the frame 150. The adhesive is preferably high in viscosity and thixotropy to prevent the adhesive from spreading over the metal frame 150 and protruding from the opening of the frame 150. The frame 150 is fixed to the metal plate 100 with bonding or laser welding.

In the semiconductor laser unit having the construction described above, light emitted from the semiconductor laser 110 is reflected with a reflector (not shown) in the direction normal to the top surface of the metal plate 100 and passes through the optical element 160 to be outputted outside the laser unit. Light reflected from an optical disk (not shown) travels in reverse the same route as the output light and passes through the optical element 160 to be incident on the light-receiving element on the silicon substrate 120.

As described above, in the semiconductor laser unit of this embodiment, the flexible substrate 130 protruding from both sides of the metal plate 100 is bent along the side faces of the metal plate 100 and fixed in this bent state with the frame 150. Thus, the semiconductor laser unit of this embodiment can be made small in size. Also, since the difference in width between the center portion 100a for mounting the silicon substrate 120 and the portions to which the flexible substrate 130 is bonded for each side is equal to or more than the thickness of the flexible substrate 130, the flexible substrate 130 is prevented from being heavily loaded from the frame 150. In this way, occurrence of poor connection such as disconnection in the flexible substrate 130 can be avoided.

In the semiconductor laser unit of this embodiment, the flexible substrate 130 that allows formation of fine-pitch wiring is used as a wiring substrate. Therefore, the wiring pitch in the inner portions, reduction of which was restricted in the conventional cases using the lead frame and the like, can be made as narrow as about one-fifth of the conventional pitch. In this way, the semiconductor laser unit of this embodiment can achieve both increase of the number of pins for function enhancement and size reduction simultaneously. Therefore, by using the semiconductor laser unit of this embodiment for an optical pickup device of an optical disk drive, a thin and multi-functional optical disk drive can be implemented.

Also, in the semiconductor laser unit of this embodiment, the silicon substrate 120 on which the semiconductor laser 110 is mounted and the light-receiving element is formed is placed on the metal plate 100. This means that the entire region underlying the light receiving/emitting portions as the heat-producing sources is formed of metal, and thus heat produced in the light receiving/emitting portions can be easily dissipated. As a result, by using the semiconductor laser unit of this embodiment for an optical pickup device of an optical disk drive, an optical disk drive usable at an ambient temperature higher than in the conventional cases can be implemented. Moreover, with the improvement in heat dissipation, it becomes possible to mount a high-power semiconductor laser.

In this embodiment, the metal plate 100 was described as having the center portion 100a that is wider than the other portions. Alternatively, as long as a portion wider than the portions covered with the flexible substrate 130 is provided in the region of the metal plate 100 over which the frame 150 is to be fitted, the center portion 100a may not be made wider. In this case, also, the flexible substrate 130 is prevented from being loaded. In other words, among the portions of the metal plate 100 covered with the frame 150, the portions coming into contact with the flexible substrate 130 should only be smaller in width than any one of the other portions.

In the fabrication method described with reference to FIGS. 1A to 1C, the silicon substrate 120 was mounted after the bonding of the flexible substrate 130 to the metal plate 100. Alternatively, the flexible substrate 130 may be placed on the metal plate 100 after the mounting of the silicon substrate 120 on the metal plate 100.

In the semiconductor laser unit of this embodiment, the opening of the frame 150 is covered with the optical element 160. This can prevent intrusion of dust and the like into the light receiving/emitting portions during assembling of the optical pickup device and the like.

Figure 3:
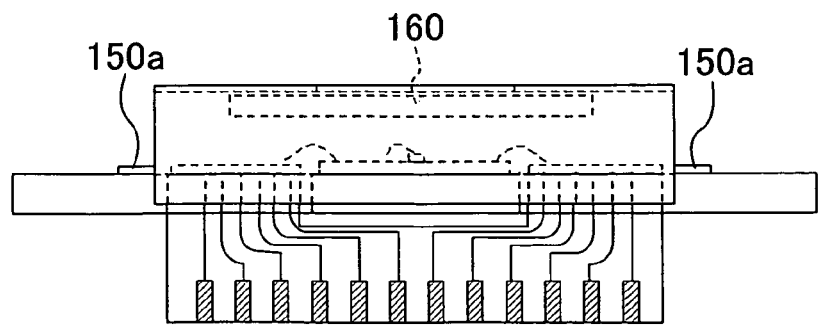
FIG. 3 is a side view of a semiconductor laser unit of a first alteration to Embodiment 1.

FIG. 3 is a side view of a semiconductor laser unit of a first alternative to Embodiment 1 according to the present invention. In the semiconductor laser unit of this embodiment, the glass optical element 160 is placed outside the frame 150 as shown in FIGS. 1C and 2B. Alternatively, the optical element 160 may be placed inside the frame 150 at the top thereof as shown in FIG. 3. In this case, also, the opening of the frame 150 is blocked with the optical element 160, and thus intrusion of dust and the like into the light receiving/emitting portions can be prevented. In this way, the semiconductor laser unit shown in FIG. 3 can be installed into an optical pickup device without impairment of the properties of the light receiving/emitting portions.

In the semiconductor laser unit of this embodiment, the flexible substrate is neither put in three-dimensional placement nor bent at wiring connection portions connecting with the light receiving/emitting elements, unlike the conventional semiconductor laser unit described in Japanese Laid-Open Patent Publication No. 2002-198605. This makes the assembly easy and suppresses increase of the fabrication cost.

In the above description, the frame 150 was fixed to the metal plate 100 and then the optical element 160 was fixed to the frame 150 with an adhesive. Alternatively, the optical element 160 may previously be fixed to the frame 150 with low-melting glass and then the resultant frame 150 may be fixed to the metal plate 100.

The metal plate 100 may be formed of a metal other than copper, although use of copper is preferred since it can hold down the cost.

A transparent resin may fill the space defined by the metal plate 100 and the frame 150.

The frame 150 has another effect of preventing unnecessary external light from being incident on the light-receiving element placed on the center portion 100a. The frame 150 may be formed of a material other than metal.

Figure 4:
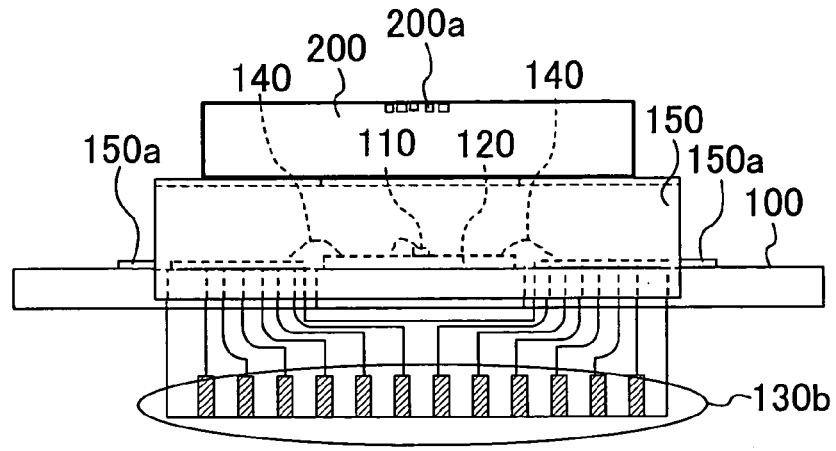
FIG. 4 is a side view of a semiconductor laser unit of a second alteration to Embodiment 1.

FIG. 4 is a side view of a semiconductor laser unit of a second alternative to this embodiment. As shown in FIG. 4, an optical element 200 having a hologram pattern 200a for diffracting light may be placed on the frame 150. This allows for efficient incidence of reflected light from the optical disk on the light-receiving portion on the silicon substrate 120 and can simplify the construction of the resultant optical pickup device.

Any semiconductor substrate other than the silicon substrate may be used as the substrate having a light-receiving element and a signal processing circuit formed thereon.

Embodiment 2

An optical pickup device of Embodiment 2 according to the present invention will be described with reference to FIGS. 5A and 5B.

Figure 5A:
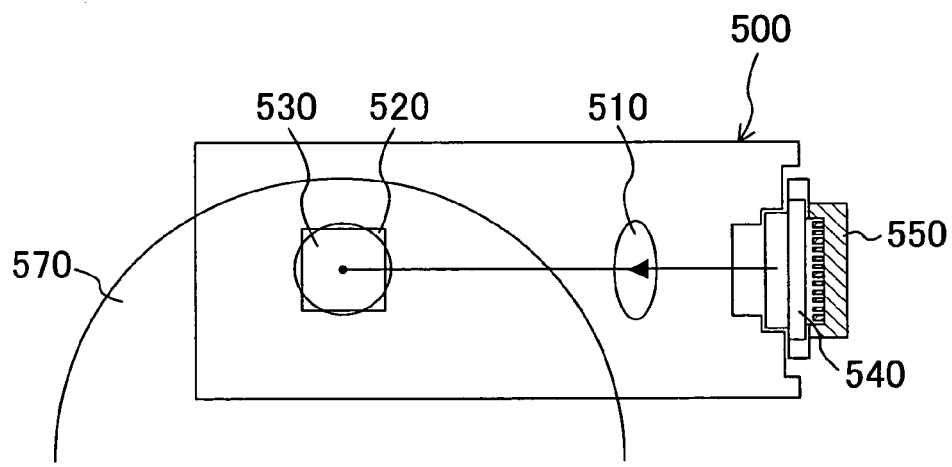
FIGS. 5A and 5B are a top view and a cross-sectional view, respectively, of an optical pickup device of Embodiment 2 according to the present invention.
Figure 5B:
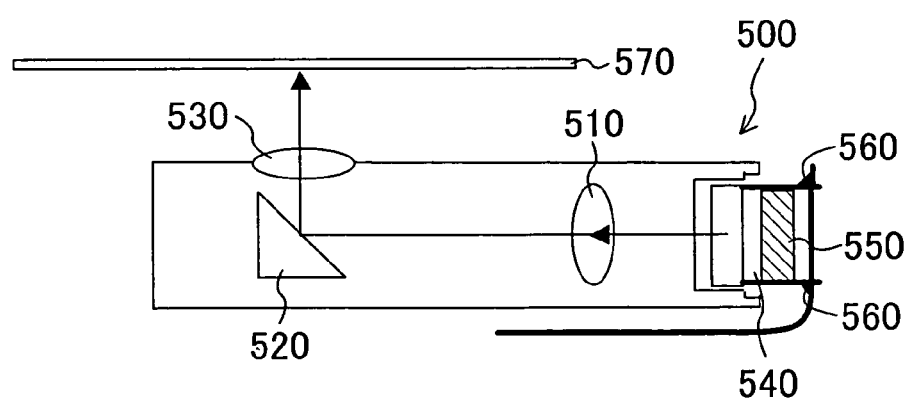
Figure 6A:
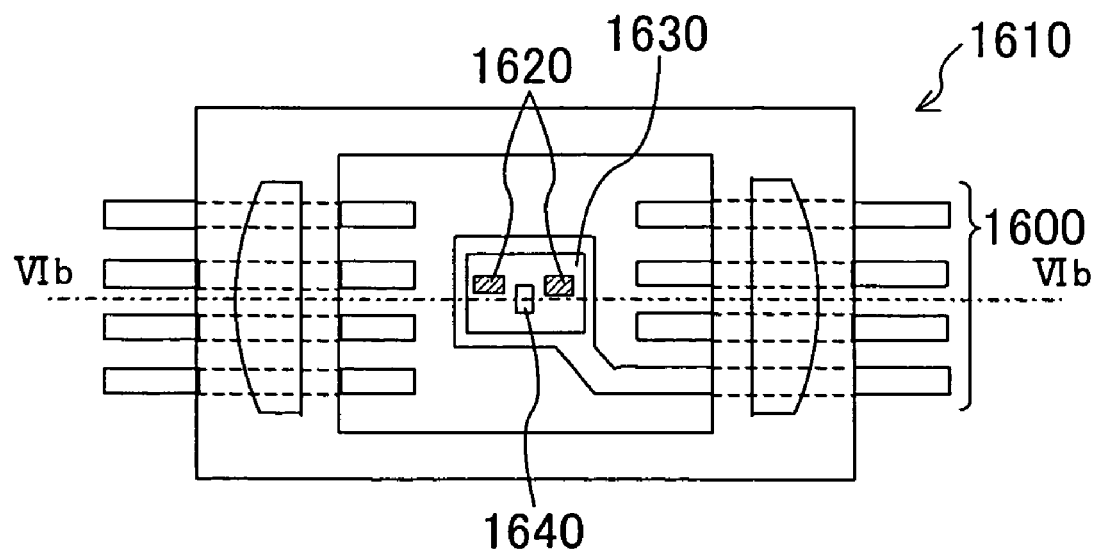
FIG. 6A is a top view of a conventional semiconductor laser unit.
Figure 6B:
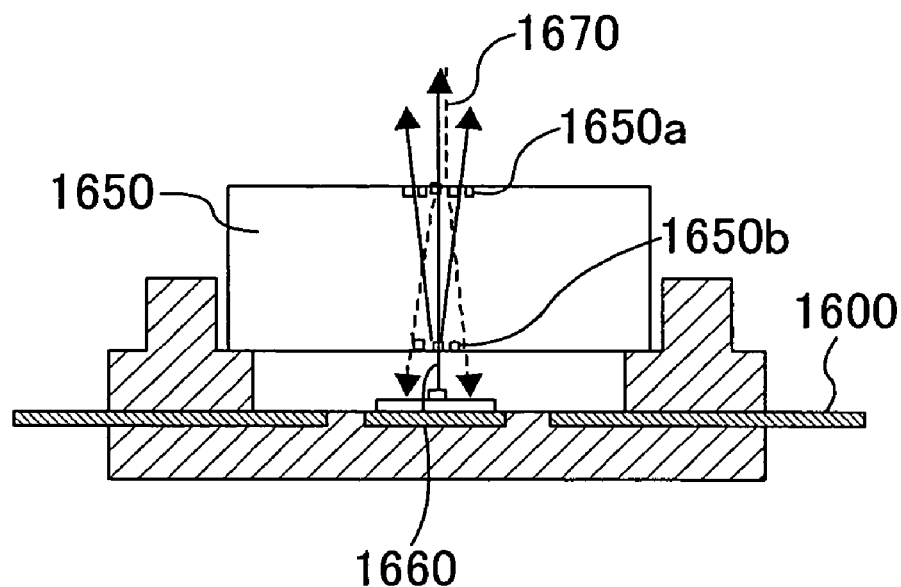
FIG. 6B is a cross-sectional view of the conventional semiconductor laser unit taken along line VIb-VIb in FIG. 6A.

FIG. 5A is a top view of an optical pickup device 500 of this embodiment, and FIG. 5B is a cross-sectional view of the optical pickup device 500.

The optical pickup device 500 of this embodiment includes: a collimating lens 510, a reflector 520; an objective lens 530; a semiconductor laser unit 540 as the semiconductor laser unit of Embodiment 1; and a heat dissipation block 550 fixedly bonded to the back surface of the metal plate of the semiconductor laser unit 540 with an adhesive such as a silicone thermal-conductive adhesive. Laser light outputted from the semiconductor laser unit 540 travels via the collimating lens 510, the reflector 520 and the objective lens 530 to illuminate an optical disk 570. Reflected light from the optical disk 570 travels in reverse the same route to be incident on the semiconductor laser unit 540.

Wiring connection between the outer portions of the flexible substrate of the semiconductor laser unit 540 and a flexible substrate of the optical pickup device is made at soldering points 560 located outside the optical pickup device 500.

As described above, the optical pickup device 500 includes the heat dissipation block 550 on the back surface of the metal plate of the semiconductor laser unit 540, and the metal plate of the semiconductor laser unit 540 is in contact with part (a case) of the optical pickup device 500. Accordingly, the heat dissipation area greatly expands increasing the heat dissipation effect, to allow heat generated in the semiconductor laser to be efficiently dissipated externally. As a result, stable operation is ensured for the optical pickup device 500 of this embodiment.

The flexible substrate is used as a wiring substrate in the semiconductor laser unit 540 constituting the optical pickup device 500 of this embodiment, and wiring connection between the flexible substrate of the semiconductor laser unit 540 and a flexible substrate of the optical pickup device is made at the soldering points 560 located on the outer surface of the optical pickup device 500. Accordingly, the distance between the optical element and the outer portions as the soldering points can be twice as long as that in the conventional structure. This can greatly reduce the thermal load to be imposed on the optical element inside the semiconductor laser unit 540 during assembly of the optical pickup device 500 of this embodiment by soldering.

More specifically, since the distance between the soldering points 560 and the optical element is sufficiently apart from each other, the optical element and the adhesive fixing the optical element will not be heated up to their heat-resistant temperatures or higher by heat conduction during the wiring connection by soldering. This can prevent occurrence of coming off of antireflection films formed on the grating pattern and hologram pattern of the optical element and displacement of the optical element due to softening of the adhesive, and thus protect the optical element from degrading in its properties and reliability.

Since the flexible substrate of the semiconductor laser unit 540 as Embodiment 1 according to the present invention does not protrude on both sides of the metal plate, the thickness of the optical pickup device can be made thinner than in the conventional cases.

In the optical pickup device 500 of this embodiment, the metal plate of the semiconductor laser unit 540 and the heat dissipation block 550 were fixedly bonded to each other with a silicone adhesive. The adhesive is not limited to this, but any adhesive high in thermal conductivity can be used. For example, a graphite sheet high in heat conductivity may be used.

The semiconductor laser unit of the present invention described above can be used for optical pickup devices of optical disk drives and the like.

While the present invention has been described in preferred embodiments, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A semiconductor laser unit, comprising:
   a metal plate having a first portion and a second portion wider than the first portion;
   a flexible substrate having a first opening and a wiring pattern, part of the flexible substrate being bonded to the top surface of the first portion;
   a semiconductor substrate mounted on the top surface of the second portion of the metal plate located inside the first opening as viewed from the top, the semiconductor substrate having a light-receiving element;
   a light-emitting element placed on the semiconductor substrate; and
   a frame having a second opening at a position overlapping the light-emitting element as viewed from the top and covering the first portion, the second portion and the semiconductor substrate, the frame fixing the flexible substrate in the state of being bent along from the top surface to both side faces of the first portion.

2. The semiconductor laser unit of claim 1, wherein the second portion is a center portion of the metal plate,
   the semiconductor substrate is mounted on the top surface of the center portion of the metal plate, and
   the flexible substrate is fixed so that the first opening extends over the top surface and both side faces of the second portion.

3. The semiconductor laser unit of claim 1, further comprising an optical element covering the second opening.

4. The semiconductor laser unit of claim 3, wherein the optical element has a pattern for diffracting incident light.

5. The semiconductor laser unit of claim 1, wherein the metal plate is formed of metal including copper.

6. The semiconductor laser unit of claim 1, wherein the difference in width between the first portion and the second portion for each side is equal to or more than the thickness of the flexible substrate.

7. An optical pickup device comprising a semiconductor laser unit, the semiconductor laser unit comprising:
   a metal plate having a first portion and a second portion wider than the first portion;
   a flexible substrate having a first opening and a wiring pattern, part of the flexible substrate being bonded to the top surface of the first portion;
   a semiconductor substrate mounted on the top surface of the second portion of the metal plate located inside the first opening as viewed from the top, the semiconductor substrate having a light-receiving element;
   a light-emitting element placed on the semiconductor substrate; and
   a frame having a second opening at a position overlapping the light-emitting element as viewed from the top and covering the first portion, the second portion and the semiconductor substrate, the frame fixing the flexible substrate in the state of being bent along from the top surface to both side faces of the first portion.

* * * * *